(12) United States Patent
Markert et al.

(10) Patent No.: US 6,771,062 B1
(45) Date of Patent: Aug. 3, 2004

(54) APPARATUS FOR SUPPORTING AND MANIPULATING A TESTHEAD IN AN AUTOMATIC TEST EQUIPMENT SYSTEM

(75) Inventors: Niels Markert, Santa Clara, CA (US); Anthony Le, Santa Clara, CA (US); Robert Sauer, Santa Clara, CA (US)

(73) Assignee: Advantest Corporation, Ora-gun (JP)

( * ) Notice: Subject to any disclaimer, the term of this patent is extended or adjusted under 35 U.S.C. 154(b) by 0 days.

(21) Appl. No.: 10/438,364

(22) Filed: May 14, 2003

(51) Int. Cl.$^7$ ................................................ G01R 1/04
(52) U.S. Cl. ................................ 324/158.1; 324/158.1
(58) Field of Search ............................. 324/158.1, 765, 324/754, 758; 414/220, 216, 222, 664, 668, 590, 673; 73/866.5, 865.7, 865.9

(56) References Cited

U.S. PATENT DOCUMENTS

| | | | | |
|---|---|---|---|---|
| 5,149,029 A | * | 9/1992 | Smith | 248/124.2 |
| 5,608,334 A | * | 3/1997 | Holt | 324/758 |
| 6,023,175 A | * | 2/2000 | Nunomiya et al. | 326/68 |
| 6,057,695 A | * | 5/2000 | Holt et al. | 324/758 |
| 6,271,657 B1 | * | 8/2001 | Nemoto | 324/158.1 |

* cited by examiner

Primary Examiner—Kamand Cuneo
Assistant Examiner—Jimmy Nguyen
(74) Attorney, Agent, or Firm—Morrison & Foerster LLP

(57) ABSTRACT

An apparatus for supporting and manipulating a testhead for testing semiconductor devices includes a supporting frame, plates adapted to be mounted on opposite sides of the testhead and controllable shafts that connect the supporting frame to the plates. Each plate has an opening in which a flanged bearing is fitted. The testhead is mounted by moving the respective shafts through the flanged bearings within the openings of plates. In this manner, the shafts support the testhead on two fixed pivots. The shafts also provide a fixed axis of rotation about which the testhead can be rotated. The testhead can be locked in a particular position about the fixed rotation axis by a locking pin inserted into one of a plurality of locking holes surrounding the plate opening. A lever arm connected to the locking pin is utilized to change the radial position of the testhead. The testhead is dismounted by unlocking the locking pin and moving the shafts from the flanged bearings.

29 Claims, 6 Drawing Sheets

US 6,771,062 B1

APPARATUS FOR SUPPORTING AND MANIPULATING A TESTHEAD IN AN AUTOMATIC TEST EQUIPMENT SYSTEM

BACKGROUND OF THE INVENTION

1. Field of the Invention

The present invention relates to an apparatus for supporting and manipulating a testhead in an automatic test equipment system.

2. Description of the Related Art

Automatic test equipment (ATE) systems test semiconductor integrated circuits. FIG. 1 illustrates a conventional ATE system. A tester 1 generates test signals which are transmitted to a testhead 2 through cables 3. The testhead 2, as shown by the cut-away view, houses a plurality of printed circuit boards or pin cards 4. The test signals are transmitted from the pin cards 4 to contact pins or pogo pins 5. The contact pins 5 are represented schematically in FIG. 1 by arrows. It should be noted that the number of contact pins is much greater than what is illustrated in FIG. 1 and that the various elements of the ATE system in FIG. 1 are not drawn to scale.

The pogo pins 5 extend through the top surface 6 of the testhead 2. The pogo pins 5 are spring-loaded and press against the loadboard 7 to establish electrical contact for testing. The loadboard 7 is in turn a mount for socket 8. A device under test (DUT) 9 is inserted into socket 8 to establish electrical contact for testing. Thus, the test signals are transmitted from the tester 1 to the DUT 9 through the pin cards 4, contact pins 5, loadboard 7 and socket 8. The resulting signals from the DUT 9 are received by the tester 1 for evaluation through the same elements.

In various phases of testing such as debug, characterization and production testing, the testhead is connected to other equipment, such as automatic handlers and probers. Such connections require the tilting and rotating of the testhead as well as its mounting and dismounting. Because the testhead is large and heavy, specialized support structure is necessary to support and manipulate the testhead during testing.

FIG. 1 illustrates the testhead 2 supported by support structure 10. The support structure 10 is connected to a pneumatic or electrically controlled manipulator 11 for manipulating the testhead 2. The manipulator 11 is driven by internal electrical motor 12. However, such support structures with manipulators are very costly and bulky, require significant floor space, use power and energy and need extra manpower to operate. Furthermore, some operations such as dismounting are particularly complicated with the electrical or pneumatic connections.

BRIEF SUMMARY OF THE INVENTION

It is an object of the present invention to provide an apparatus for supporting and manipulating a testhead that overcomes the above limitations of conventional support and manipulating mechanisms. The apparatus of the present invention provides an apparatus that supports the testhead through the use of a fixed axis about which the testhead can be rotated. The present invention can be employed utilizing simple mechanical means, thereby proving a cost-effective and space-efficient alternative to conventional mechanisms.

In one embodiment of the present invention, a testhead is supported and manipulated through manually-controllable shafts that connect a supporting frame to plates adapted to be mounted on opposite sides of the testhead.

The supporting frame has two members that extend from the base of the frame and along the side of the testhead. The end of each member has an opening for a shaft, and a shaft is disposed in each opening. The respective shafts are connected to hand levers that allow the shafts to be moved in a horizontal direction toward plates mounted on opposite sides of the testhead. Each plate has hole in which a flanged bearing is fitted. The testhead is mounted by moving the respective shafts through the flanged bearings inside the holes of plates. In this manner, the shafts support the testhead on two fixed pivots. The shafts also provide a fixed axis of rotation about which the testhead can be manipulated. For example, the testhead can be rotated relative to the shafts around the fixed rotation axis in a counter-clockwise direction.

Each plate can include a diagonal hole for controlling the speed of rotation. The diagonal hole begins at the surface of one side of the plate and continues through the plate to its opening. The flanged bearing has a cut through its length. A pressure screw is placed in the diagonal hole to abut the flanged bearing. When the pressure screw is tightened, the flanged bearing tightens on the shaft. Thus, a user can adjust the friction to control the speed of rotation of the testhead. It should be noted that other devices can be used to achieve damping of the rotation, such as tension straps and hydraulic vanes.

To lock the testhead in a particular position about the fixed rotation axis, each plate contains locking holes surrounding the plate opening and corresponding to a plurality of radial positions about the rotation axis. A locking pin is inserted into one of the locking holes to lock the testhead in a given position.

To change the radial position of the testhead, a lever arm is pulled out of a locking groove in a member of the frame. The lever arm rotates about a fixed vertical axis. Because the lever arm is connected to the locking pin, the pulling out of the lever arm pulls out or linearly displaces the locking pin from the locking hole of the plate (hereinafter referred to as the unlocked position). At this stage, the testhead can be rotated about the rotation axis. During rotation of the testhead, the lever arm is released. The lever arm is connected at the other end to a spring-loaded guide pin. The guide pin urges the lever arm to rotate back into locking groove. Because the lever arm is connected to the locking pin, the locking pin is pressed against plate between the previous locking hole and the next locking hole. When the locking pin encounters the next locking hole, it is forced into the hole and locks the testhead in the new radial position.

If a new radial position is not desired and the testhead needs to be dismounted, the testhead can easily be dismounted. With the locking pin withdrawn from the locking hole, the shafts are moved by their respective hand levers in a horizontal direction away from the plates mounted on opposite sides of the testhead. As the shafts leave the flanged bearings inside the holes of plates, the testhead is dismounted.

These and other features and advantages of embodiments of the present invention will be apparent to those skilled in the art from the following detailed description of the embodiments of the invention, when read with the drawings and the appended claims.

DETAILED DESCRIPTION OF THE INVENTION

In the following description of preferred embodiments, reference is made to accompanying drawings which form a part hereof and in which is shown by way of illustration specific embodiments in which the invention may be practiced. It is to be understood that other embodiments may be utilized and structural changes may be made without departing from the scope of the preferred embodiments of the present invention.

Figure 2:
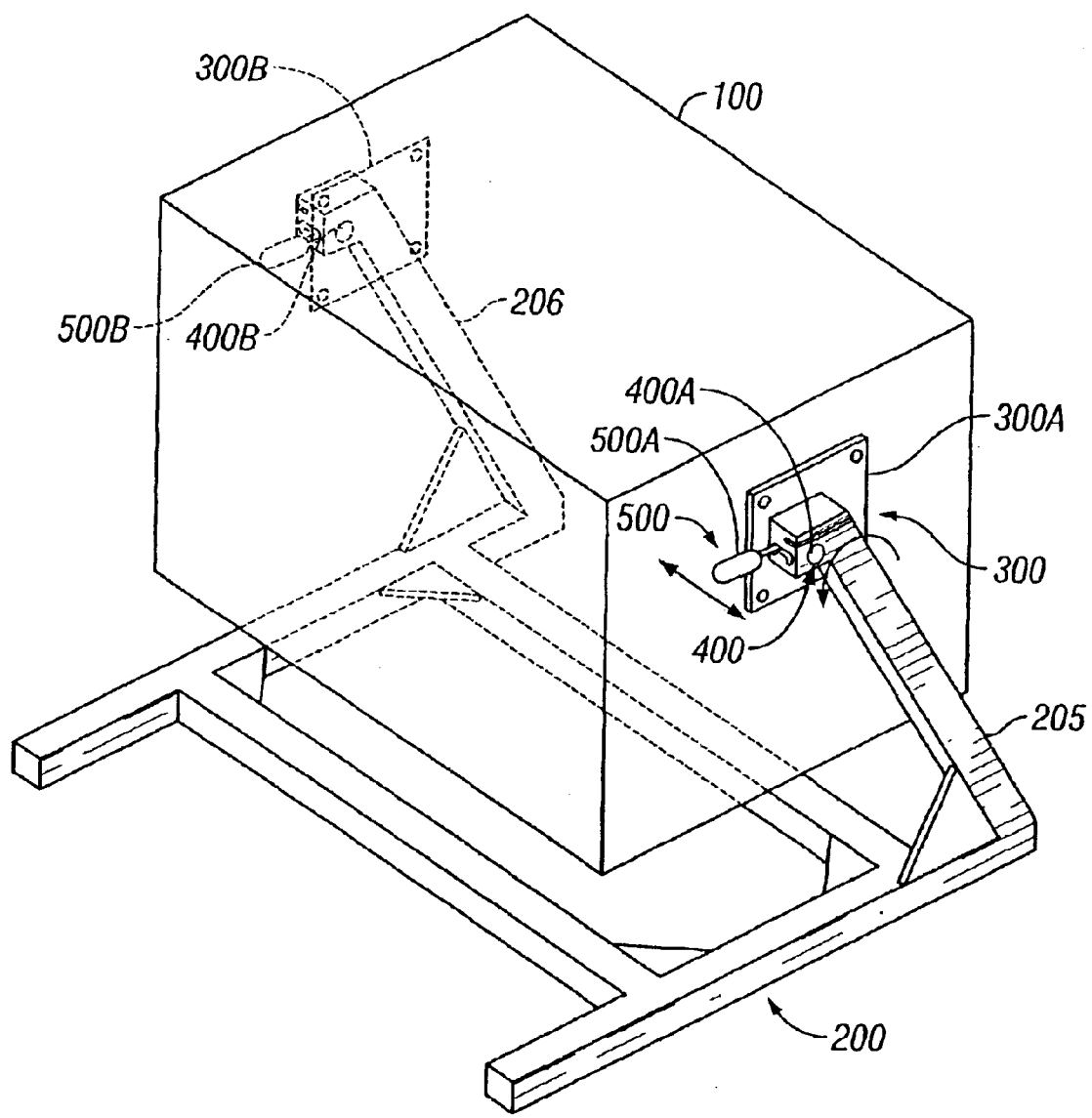
FIG. 2 is a perspective view of one embodiment of the present invention.

FIG. 2 illustrates one embodiment of the present invention for supporting and manipulating a testhead 100 (shown as a rectangular box without a loadboard, socket and DUT). The testhead 100 is supported and manipulated through a frame or stand 200, a plate 300 and a shaft 400 connected to a hand lever 500.

The stand 200 has two opposing members or branches 205 and 206 that extend from the base of the stand 200 and along the side of the testhead 100. The end of each branch 205 and 206 has an opening for shafts 400A and 400B, respectively. Shafts 400A and 400B are connected to hand levers 500A and 500B, respectively. These levers allow shafts 400A and 400B to be moved respectively in a horizontal direction as indicated by the horizontal arrows in FIG. 2.

Plates 300A and 300B are attached by four screws to the respective sides of the testhead 100. It should be noted that the screws for attaching the plates to the testhead are shown schematically. Each plate has hole in which a flanged bearing is fitted (neither the holes nor the bearings are shown in FIG. 2). The testhead 100 is mounted by moving the shafts 400A and 400B through the flanged bearings inside the holes of plates 300A and 300B, respectively. In this manner, shafts 400A and 400B support the testhead 100 on two fixed pivots. The shafts 400A and 400B provide a fixed axis of rotation about which the testhead 100 can be manipulated. For example, the testhead 100 can be rotated relative to the shafts around the fixed rotation axis in a clockwise or counter-clockwise direction (the arrow in FIG. 2 indicates a counter-clockwise rotation). The testhead 100 can be easily dismounted by withdrawing the shafts 400A and 400B from the plates 300A and 300B, respectively. Although FIG. 2 illustrates the present embodiment with the stand 200 having two branches 205 and 206, two plates 300A and 300B and two shafts 400A and 400B, a single branch, plate and shaft may be also utilized.

Figure 1:
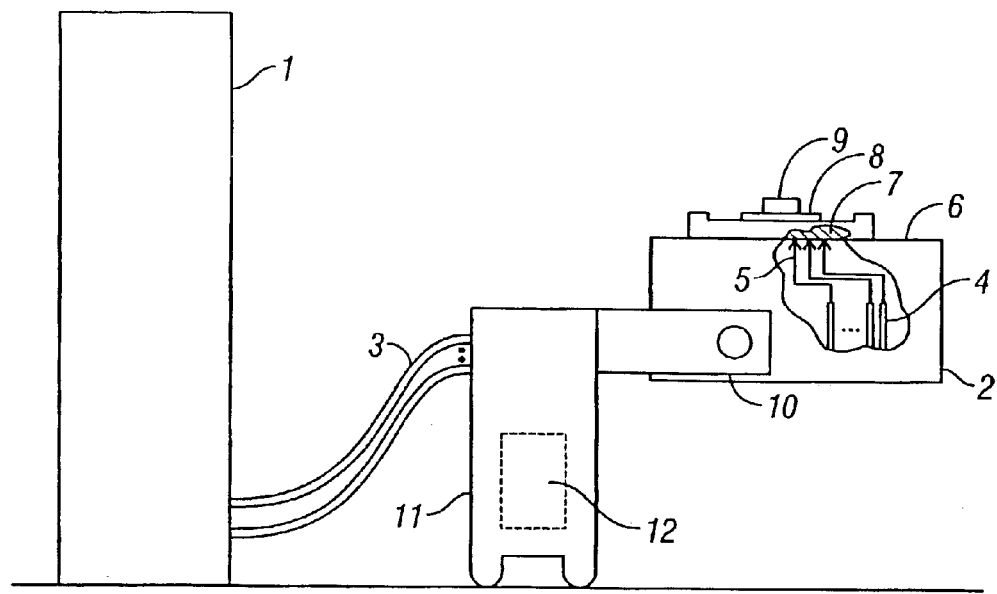
FIG. 1 is a side view of a conventional ATE system.
Figure 3:
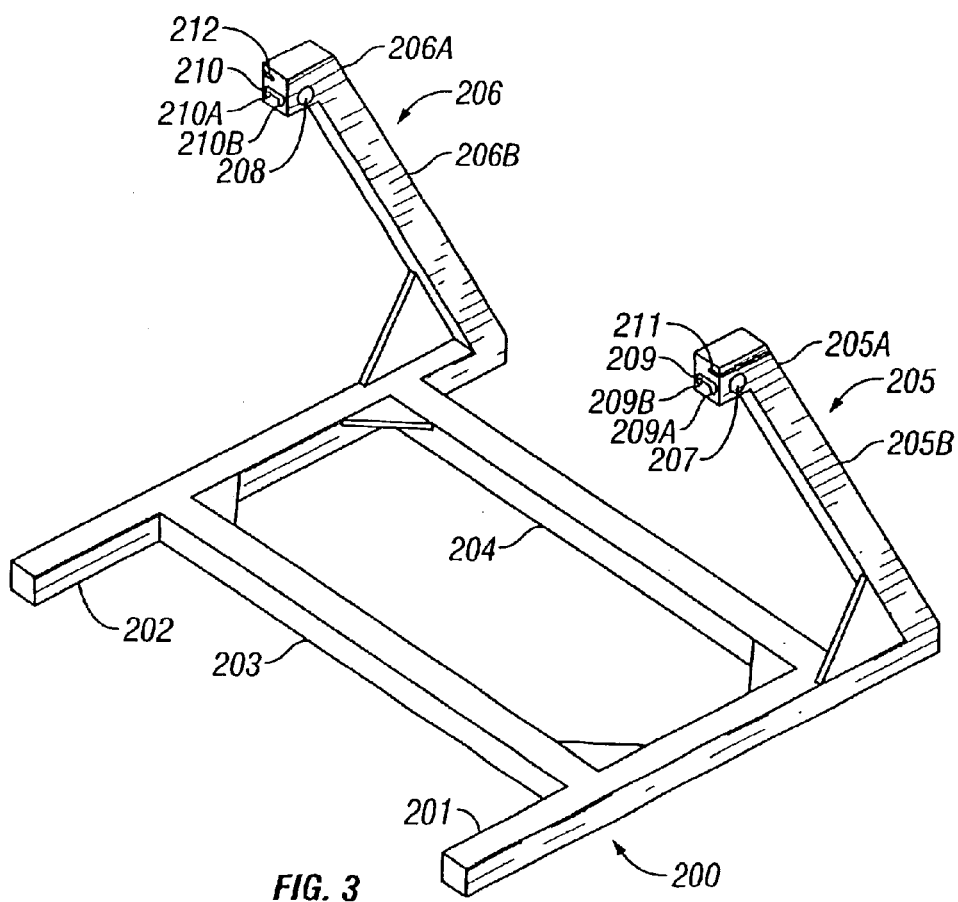
FIG. 3 is a perspective view of a frame of one embodiment of the present invention.

FIG. 3 illustrates a detailed perspective view of the stand 200. The stand 200 includes a base with two branches 205 and 206. The base comprises two parallel members 201 and 202 connected by transverse members 203 and 204. These members are hollow aluminum alloy tubes, but can be made of any other suitable material such as cast iron. Branches 205 and 206 are connected at one end of the parallel members 201 and 202. The members 201 and 202 and the branches 205 and 206 are connected in a semi-triangular shape. Any other shape that provides the same functionality and stability may also be used. Branches 205 and 206 are hollow aluminum alloy tubes like the parallel members 201 and 202 and the transverse members 203 and 204, except for their respective top sections 205A and 206A.

Figure 5:
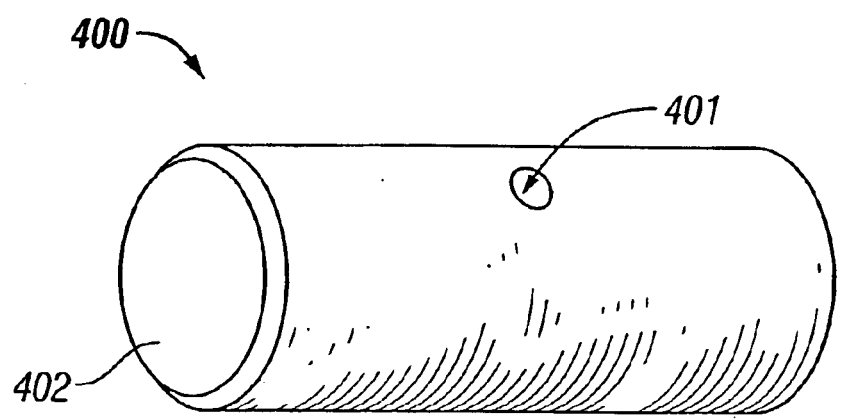
FIG. 5 is a perspective view of a shaft of one embodiment of the present invention.
Figure 6:
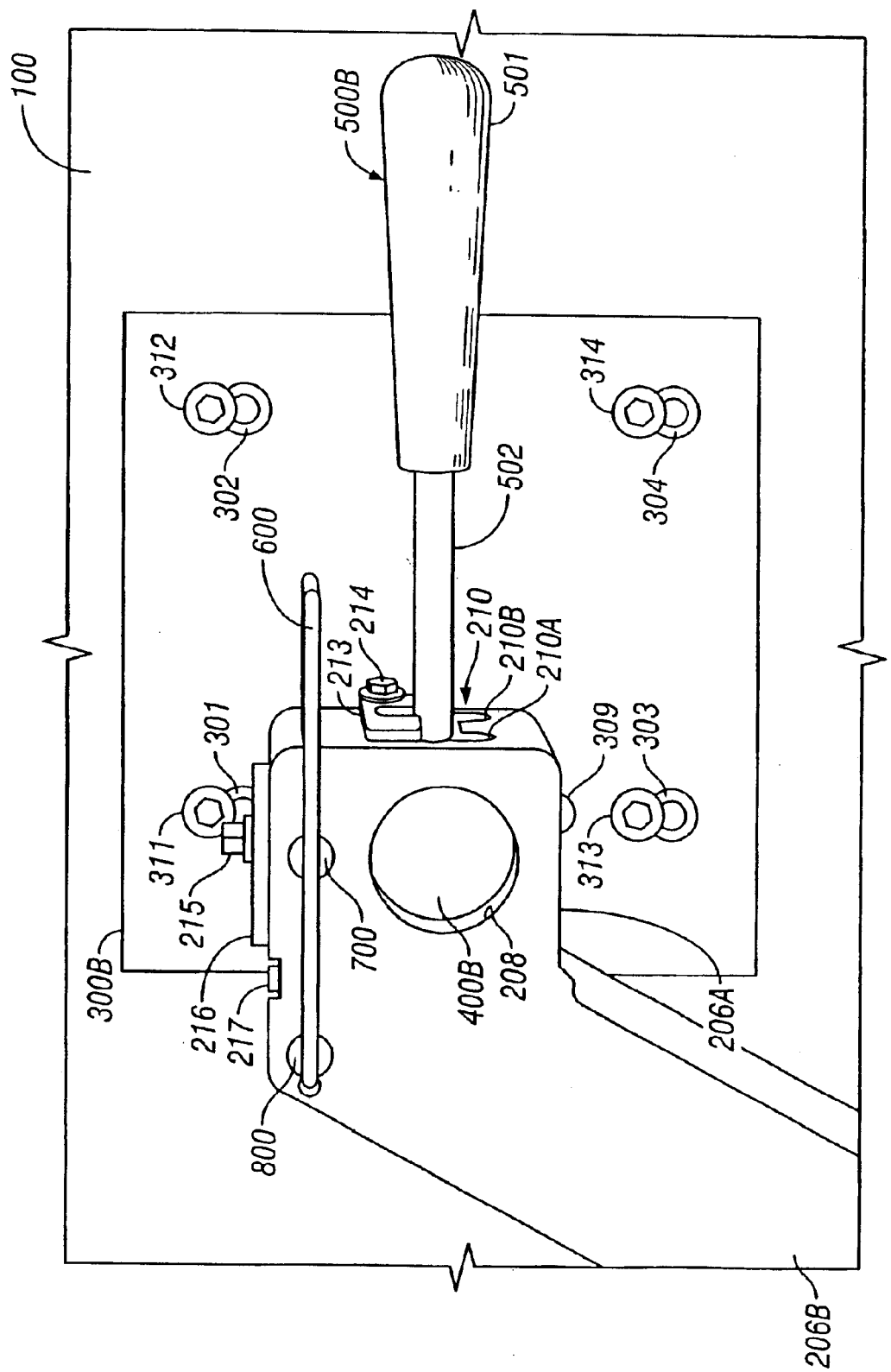
FIG. 6 is a partial perspective view of a testhead supported by one embodiment of the present invention.

Top sections 205A and 206A have respective holes or openings 207 and 208, U-shaped grooves 209 and 210 and locking grooves 211 and 212. Openings 207 and 208 hold shafts 400A and 400B, respectively. FIG. 5 illustrates an exemplary shaft 400. Shaft 400 is a spindle shaft but any appropriate shaft can be utilized. The shaft 400 has a hole 401 in which a lever can be screwed in or fitted. FIG. 6, for example, illustrates a lever 502 connected to a plastic handle 501 (the lever and handle constitute hand lever 500B). In this manner, the shafts 400A and 400B are attached to hand levers 500A and 500B, respectively, with the levers manually operable to control the movement of the shafts through their respective openings 207 and 208. The end of the shaft 402 can be thus be moved into the flanged bearing fitted in the plate 300. It should be noted that the shafts can also be moved or controlled by electrical and pneumatic means.

The movement of hand levers 500A and 500B is guided and limited by U-shaped grooves 209 and 210. The arms or ends of the U-shaped grooves 209 and 210 define the position of the hand levers 500A and 500B and thus the position of the shaft 400A and 400B. For example, if the hand lever 500B is at the bottom of the left armor end 210A of U-shaped groove 210, then the shaft 400B is not connected to the testhead 100. Conversely, if the hand lever 500B is at the bottom of the right arm or end 210B of U-shaped groove 210, then the shaft 400B is connected to the testhead 100 through plate 300B. The distance between the two arms 210A and 210B of the U-shaped groove 210 defines the extent of movement of shaft 400B.

Figure 4:
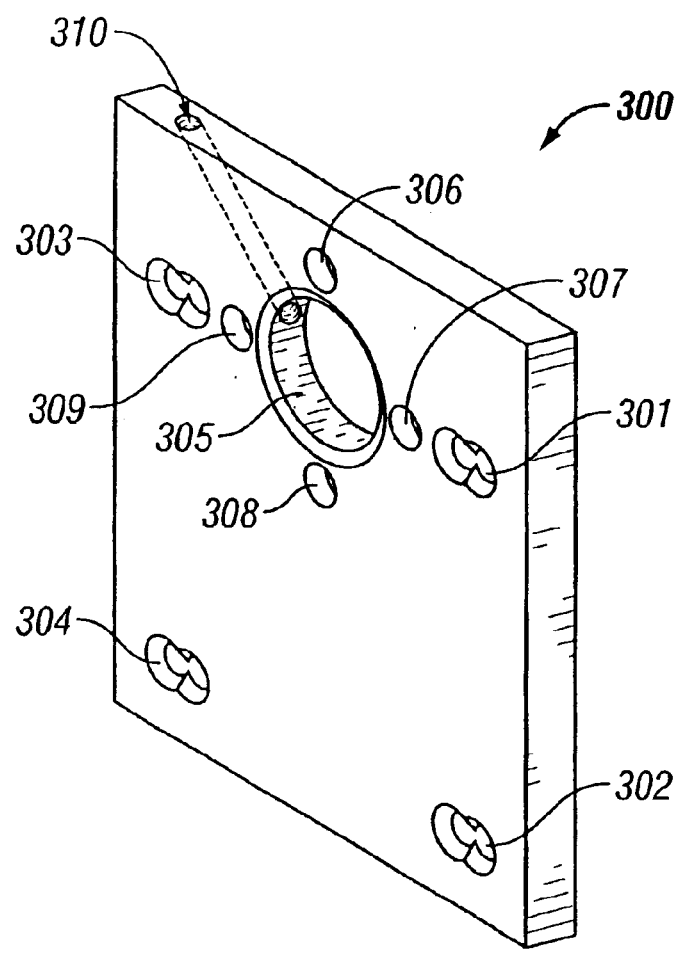
FIG. 4 is a perspective view of a plate of one embodiment of the present invention.
Figure 12:
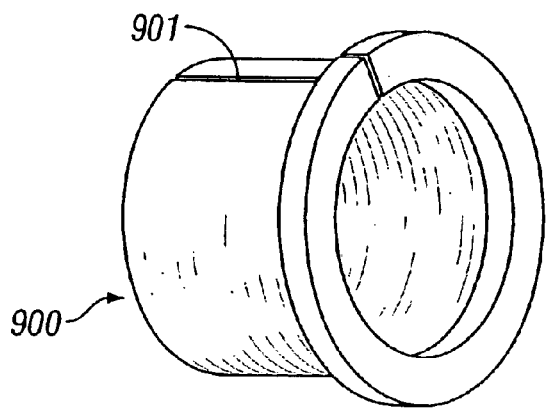
FIG. 12 is a perspective view of a flanged bearing of one embodiment of the present invention.

FIG. 4 illustrates a detailed perspective view of the plate 300. The plate 300 is attached to the testhead 100 by screws through screw holes 301 302 303 and 304. The holes are designed with double holes to provide mounting flexibility. The plate 300 contains a shaft hole or opening 305 in which a flanged bearing is fitted (the flanged bearing 900 is illustrated in FIG. 12). The testhead 100 is mounted by moving a shaft through the flanged bearing inside the shaft opening 305. It should be noted that other arrangements can be used for connecting the shaft and the plate, such as arrangements not utilizing a flanged bearing. It should also be noted that the shaft opening and its corresponding opening on the stand (as well as the shaft) can have cross-sections other than circular, such as elliptical.

Once the shaft is coupled to the plate by the flanged bearing, the shaft provides a fixed rotation axis to support the testhead and about which the testhead can be manipulated, such as by rotation. The plate 300 includes a diagonal hole 310 for controlling the speed of rotation. The diagonal hole 310 begins at the surface of one side of the plate 300 and continues through the plate 300 to shaft opening 305. As illustrated in FIG. 12, the flanged bearing 900 has a cut 901 through its length. A pressure screw (not shown in FIG. 4) is placed in the diagonal hole 310 to abut the flanged bearing 900. When the pressure screw is tightened, the flanged bearing 900 tightens on the shaft. Thus, a user can adjust the friction to control the speed of rotation of the testhead 100. It should be noted that other devices can be used to achieve damping of the rotation, such as tension straps and hydraulic vanes.

To lock the testhead 100 in a particular position about the fixed rotation axis, the plate 300 contains locking holes 306 307 308 and 309 surrounding shaft opening 305 and thus corresponding to a plurality of radial positions about the rotation axis. A locking pin (illustrated in FIGS. 6–9 as 700) is inserted into one of the locking holes to lock the testhead in a given position. FIG. 4 illustrates four locking holes that define rotation positions at 0°, 90°, 180° and 270°. However, it should be noted that any number of locking holes can be utilized to define different rotation positions. For example, locking holes can be further positioned around the shaft hole to define rotation positions at 45°, 135°, 225° and 295°.

Figure 7:
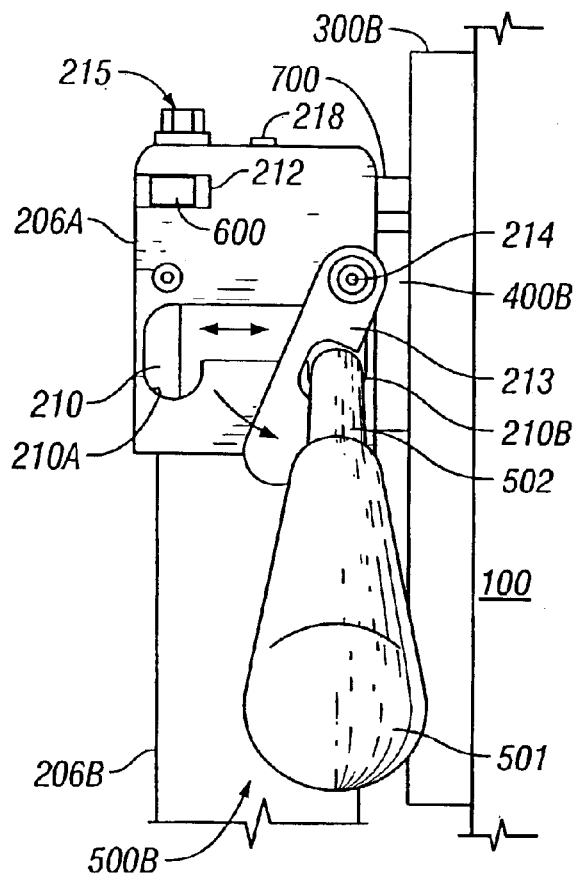
FIG. 7 is another partial perspective view of a testhead supported by one embodiment of the present invention.
Figure 8:
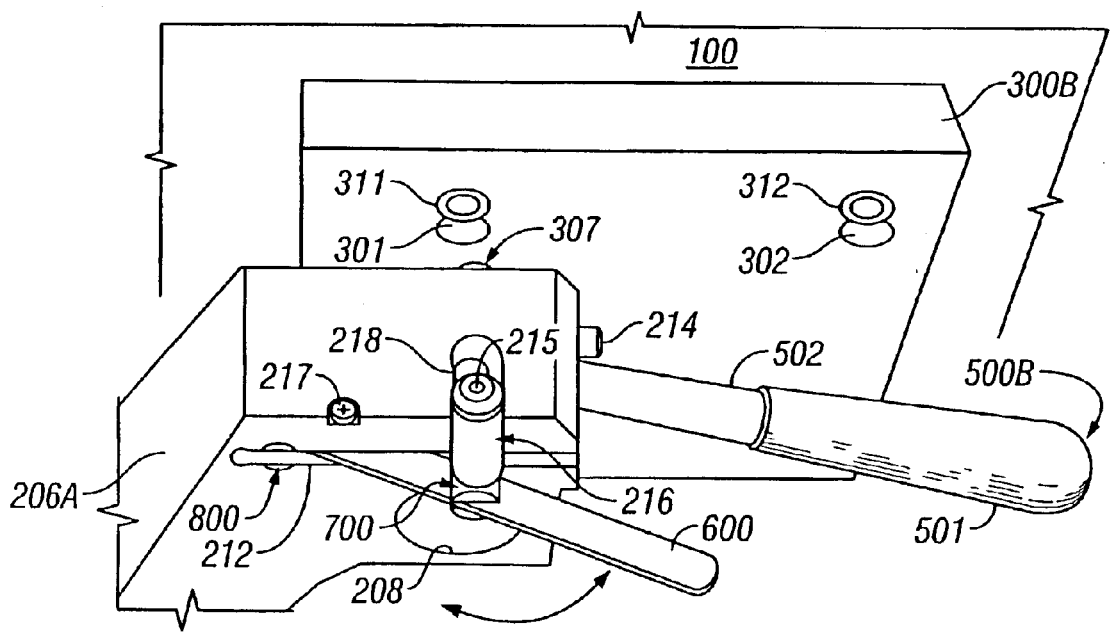
FIG. 8 is a partial perspective of one embodiment of the present invention in an unlocked position for manipulating the testhead.

FIGS. 6, 7 and 8 illustrate detailed partial perspective views of stand branch 206, plate 300B, shaft 400B and hand lever 500B in various arrangements. FIGS. 6, 7 and 8 also illustrate how the position of testhead can be changed about the fixed rotation axis. The discussion below references all three figures.

As illustrated in FIG. 6, the plate 300B is connected to the testhead 100 by screws 311 312 313 and 314 through the screw holes 301 302 303 and 304, respectively. The top section 206A of stand branch 206 has the opening 208 in which the shaft 400B is held or disposed. The shaft 400B is connected to the lever 502 which is, in turn, connected to the plastic handle 501. The lever 502 and plastic handle 501 constitute hand lever 500B. The hand lever 500B is used to shift the shaft 400B into and out of the flanged bearing (not shown) fitted in plate 300B. The movement of the hand lever 500B is guided and limited by U-shaped groove 210, and the distance between the two arms 210A and 210B of the U-shaped groove 210 defines the extent of movement of shaft 400B. If the hand lever 500B is at the bottom of the right arm 2101B of U-shaped groove 210 as illustrated in FIG. 7, then the shaft 400B is connected to the testhead 100 through plate 300B.

FIGS. 6 and 7 illustrate a latch 213. The latch 213 is connected to the top section 206A of stand branch 206 by screw 214 and is proximate to the hand lever 500B. The latch 213 is operatively moveable to lock the hand lever 500B when the hand lever 500B is at the bottom of the right arm 210B of U-shaped group 210. This is a safety mechanism to avoid any accidental movement of the hand lever 500B from its position at 210B, thereby pulling the shaft 400B from the flanged bearing and accidentally dismounting the testhead 100. As discussed above the locking pin 700 is inserted into one of the locking holes of plate 300B to lock the testhead 100 in a given position. The position may include one of the plurality of positions about the rotation axis. FIG. 7 illustrates the locking pin 700 inserted into one of the locking holes of plate 300B.

In order to rotate the testhead to a different position, lever arm 600 is used to move or linearly displace the locking pin 700 into and out of a given locking hole. The lever arm 600 is pulled out of locking groove 212 as illustrated in FIG. 8. The lever arm 600 rotates about screw 217 and thus is capable of pivotable movement about a fixed axis at the screw (as will be discussed below with respect to FIG. 9). Because the lever arm 600 is connected to the locking pin 700, the pulling out of the lever arm 600 pulls out or linearly displaces the locking pin 700 from the locking hole 307 of the plate 300B (hereinafter referred to as the unlocked position). In the unlocked position, the testhead can be rotated to a different radial position. During rotation of the testhead 100, the lever arm 600 is released. The lever arm 600 is connected at the other end to a spring-loaded guide pin 800. The guide pin 800 urges the lever arm to rotate back into locking groove 212. Because the lever arm 600 is connected to the locking pin 700, the locking pin 700 is pressed against plate 300B between the previous locking hole and the next locking hole. When the locking pin 700 encounters the next locking hole, it is forced into the hole and locks the testhead 100 in that position.

When the lever arm 600 is pulled out to remove the locking pin 700 from a locking hole, a stop pin 218 is used to hold the locking pin 700 in the unlocked position. This may be necessary in order to pull out the locking pin on the other side of the testhead 100. The stop pin 218 is a screw that can be tightened into a hole of the locking pin 700 and thus prevents the movement of the locking pin 700. The stop pin 218 can be secured by a clamp 216 which is connected to the top section 206A by screw 215, proximate to the stop pin 218 and is operatively moveable to clamp the stop pin 218. The clamp 216 is a safety mechanism to prevent the accidental removal of the stop pin 218. The clamp 216 may be necessary because there is constant pressure on the stop pin 218 as the guide pin 800 urges the lever arm 600 and the locking pin 700 back toward the locked position. It should be noted that the clamp 216 is not securing the stop pin 218 in FIGS. 6 and 7.

If a new radial position is not desired and the testhead needs to be dismounted, the testhead can easily be dismounted. Stop pin 218 is used to hold the locking pin 700 in the unlocked position. With the locking pin 700 withdrawn, the hand lever 500B is used to shift the shaft 400B out of the flanged bearing fitted in plate 300B. The movement of the hand lever 500B is guided by the U-shaped groove 210. Specifically, the hand lever 500B is moved from the bottom of the right arm 210B of U-shaped groove 210 to the bottom of the left arm 210A (as illustrated by the horizontal arrows in FIG. 7). In this manner, the shaft 400B is disconnected from the testhead 100 through plate 300B, and the testhead is dismounted (if only one shaft is used for connection).

Figure 9:
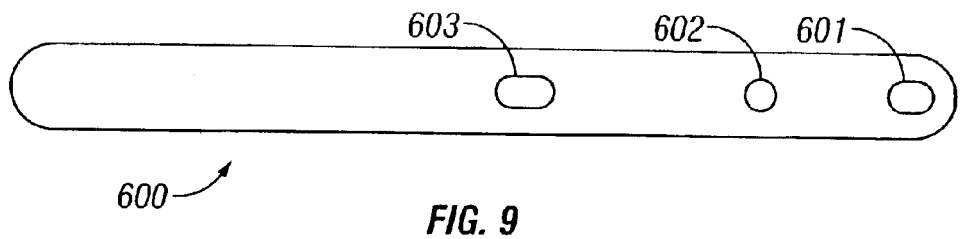
FIG. 9 is a plan view of a lever arm of one embodiment of the present invention.

As discussed above, the movement of the lever arm 600 is guided and limited by the locking groove 212 in the top section 206A of the stand branch 206. FIG. 9 illustrates the lever arm 600. The lever arm 600 is a relatively long metal member with two slots 601 and 603 and one hole or opening 602. Screw 217 is used to secure the lever arm 600 through hole 602 and allows its to pivot about a fixed vertical axis through hole 602. That is, the lever arm 600 as illustrated in FIG. 8 pivots about hole 602 in locking groove 212. Oval slot 601 is for connecting the lever arm 600 to the guide pin 800, while slot 603 is for connecting the lever arm 600 to the locking pin 700. As the lever arm 600 rotates about hole 602, the guide pin 800 and the locking pin 700 shift along their respective slots 601 and 603.

Figure 10:
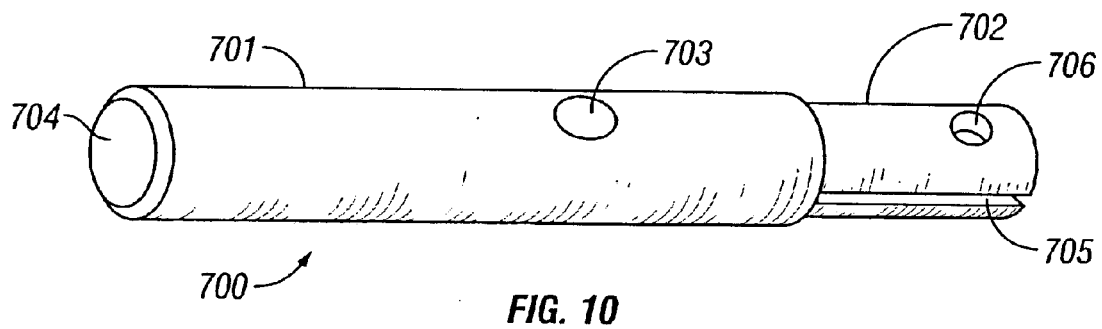
FIG. 10 is a perspective view of a locking pin of one embodiment of the present invention.

FIG. 10 illustrates the locking pin 700. The locking pin 700 comprises of two cylindrical members 701 and 702. Member 701 is inserted into the locking hole at end 704. The member has a hole or opening 703 for the stop pin 218. Member 702 has a groove 705 for placement of the lever arm 600. A hole 706 is for connecting the lever arm 600 to the locking pin 700. A press pin (not illustrated) can be used to connect the locking pin 700 and the lever arm 600 through the hole 706 and slot 603, respectively. As the lever arm 600 is rotated, the press pin moves along slot 603 and moves the locking pin 700.

Figure 11:
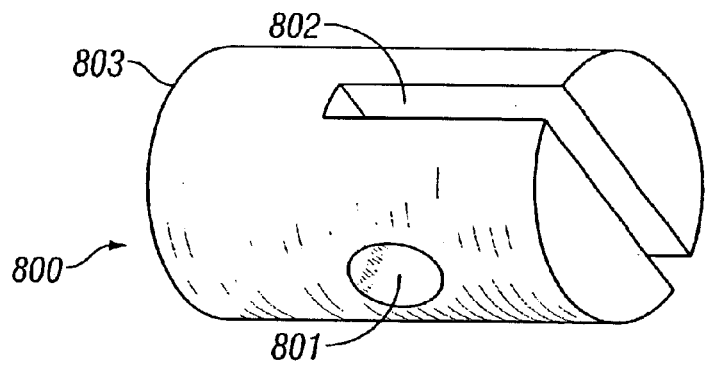
FIG. 11 is perspective view of a guide pin of one embodiment of the present invention.

FIG. 11 illustrates a guide pin 800. The guide pin 800 has a groove 802 for lever arm 600. A hole 801 is for connecting the lever arm 600 to the guide pin 800. A press pin can be used to connect the guide pin 800 and the lever arm 600 through their respective holes 801 and slot 601, respectively. As the lever arm 600 is rotated, the guide pin moves along slot 603 and is pressed against a spring at end 803. The spring (not illustrated) urges the lever arm to rotate in the opposite direction.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An assembly for supporting and rotating a testhead for testing integrated circuits comprising:

a frame comprising a base, a first member and a second member opposing the first member, each member connected to the base and having an opening;

first and second plates adapted for mounting on opposite sides of the testhead, each plate having an opening; and first and second shafts disposed within the first and second member openings respectively and operatively movable from a first position toward a second position engaged with the first and second plate openings respectively and forming a rotation axis wherein in the second position the testhead is supported and capable of pivotal movement relative to the first and second shafts about the rotation axis.

2. The assembly of claim 1, wherein in the first position the testhead is not supported and capable of being dismounted from the assembly.

3. The assembly of claim 1, further comprising first and second levers attached to the first and second shafts respectively for moving the first and second shafts between the first and second positions.

4. The assembly of claim 3, wherein the first and second members comprise first and second grooves respectively for guiding the first and second levers between the first and second positions.

5. The assembly of claim 4, wherein each of the first and second grooves is U-shaped with two ends, the first end corresponding to the first position and the second end corresponding to the second position.

6. The assembly of claim 4, further comprising first and second latch members connected to the first and second members respectively and proximate to the first and second levers respectively, the first and second latch members operatively moveable to lock the first and second levers so as to prevent the first and second levers from moving from the second position.

7. The assembly of claim 1 further comprising first and second bearings fitted within the first and second plate openings respectively to engage the first and second shafts.

8. The assembly of claim 7, wherein each of the first and second plates includes a pressure screw for adjustable frictionally coupling between the first and second bearings and the first and second shafts respectively.

9. The assembly of claim 1, wherein the first and second plates comprise a plurality of first and second locking holes arranged adjacent to the first and second plate openings respectively, said first and second locking holes corresponding to a plurality of radial positions about the rotation axis; and further comprising first and second means for locking the testhead at one of the plurality of radial positions about the rotation axis.

10. The assembly of claim 9, wherein the first and second locking means comprises:

first and second lever arms connected to the first and second members respectively and capable of pivotable movement about a fixed axis between a locked position and an unlocked position, each lever arm having a planar body with a locking end and a guide end; and first and second locking pins connected to the first and second lever arms at their respective locking ends;

wherein, at the locked position, the first and second locking pins are engaged with one of the plurality of first and second locking holes respectively and, at the unlocked position, the first and second locking pins are linearly displaced by the first and second lever arms respectively from the plurality of first and second locking holes.

11. The assembly of claim 10, further comprising:

first and second spring-loaded guide pins connected to the first and second lever arms at their respective guide ends, wherein the first and second guide pins urge the first and second lever arms respectively from the unlocked position toward the locked position such that the first and second lever arms linearly displace the first and second locking pins into one of the plurality of first and second locking holes.

12. The assembly of claim 11, further comprising first and second stop pins engageable with the first and second locking pins at the unlocked position to arrest the linear displacement of the first and second locking pins into one of the plurality of first and second locking holes.

13. The assembly of claim 12, further comprising first and second clamping members connected to the first and second members respectively and proximate to the first and second stop pins respectively, the first and second clamping members operatively moveable to clamp the first and second stop pins.

14. The assembly of claim 1, wherein the first and second shafts are spindle shafts.

15. The assembly of claim 1, wherein the first and second member openings and the first and second plate openings are circular.

16. The assembly of claim 1, wherein each of the first and second members is connected to the base to form a semi-triangle.

17. The assembly of claim 1, wherein the first and second members comprise:

first and second hollow sections respectively, the first and second hollow sections including the first and second member openings respectively; and first and second solid sections respectively, the first and second solid sections connected to the base.

18. An assembly for testing a semiconductor device comprising:

a testhead;

first and second plates adapted for mounting on opposite sides of the testhead, each plate having an opening;

means for supporting the testhead;

first and second means for connecting the supporting means to the first and second plate openings respectively; and first and second means for controlling the first and second connecting means respectively between a first position and a second position wherein in the second position the testhead is supported and capable of pivotal movement about a rotation axis.

19. The assembly of claim 18, wherein in the first position the testhead is not supported and capable of being dismounted.

20. The assembly of claim 18, further comprising means for latching the first and second controlling means at the second position.

21. The assembly of claim 18, wherein the first and second plates comprise a plurality of first and second locking holes arranged adjacent to the first and second plate openings respectively, said first and second locking holes corresponding to a plurality of radial positions about the rotation axis; and further comprising first and second means for locking the testhead at one of the plurality of radiation positions about the rotation axis.

22. The assembly of claim 21, further comprising first and second means for coupling the first and second plates to the first and second connecting means respectively.

23. The assembly of claim 22, wherein the first and second coupling means each include means for adjusting a rotation speed of the testhead about the rotation axis.

24. The assembly of claim 21, further comprising first and second means for controlling the first and second locking means respectively between a locked position and an unlocked position.

25. The assembly of claim 24, further comprising first and second means for clamping the first and second locking means at the unlocked position.

26. An apparatus for locking a testhead for testing a semiconductor device at a plurality of positions about a rotation axis, the testhead supported by first and second shafts disposed in a frame, the first and second shafts engaging first and second plates mounted on opposite sides of the testhead, the first and second plates having a plurality of first and second respective locking holes corresponding to a plurality of radial positions about the rotation axis, the apparatus comprising:

first and second lever arms connected to the frame and capable of pivotable movement about a fixed axis between a locked position and an unlocked position, each lever arm having a planar body with a locking end and a guide end; and first and second locking pins connected to the first and second lever arms at their respective locking ends;

wherein, at the locked position, the first and second locking pins are engaged with one of the plurality of first and second locking holes respectively and, at the unlocked position, the first and second locking pins are linearly displaced by the first and second lever arms respectively from the plurality of first and second locking holes.

27. The apparatus of claim 26, further comprising:

first and second spring-loaded guide pins connected to the first and second lever arms at their respective guide ends, wherein the first and second guide pins urge the first and second lever arms respectively from the unlocked position toward the locked position such that the first and second lever arms linearly displace the first and second locking pins into one of the plurality of first and second locking holes.

28. The apparatus of claim 27, further comprising first and second stop pins engageable with the first and second locking pins at the unlocked position to arrest the linear displacement of the first and second locking pins into one of the plurality of first and second locking holes.

29. The apparatus of claim 28, further comprising first and second clamping members connected to the frame and proximate to the first and second stop pins respectively, the first and second clamping members operatively moveable to clamp the first and second stop pins.

* * * * *